United States Patent
Krassnitzer et al.

(10) Patent No.: US 10,865,472 B2
(45) Date of Patent: Dec. 15, 2020

(54) LOW TEMPERATURE ARC ION PLATING COATING

(71) Applicant: Oerlikon Trading AG, Trubbach, Trubbach (CH)

(72) Inventors: Siegfried Krassnitzer, Feldkirch (AT); Denis Kurapov, Walenstadt (CH); Markus Lechthaler, Feldkirch (AT)

(73) Assignee: OERLIKON SURFACE SOLUTIONS AG, PFÄFFIKON, Pfäffikon Sz (CH)

( * ) Notice: Subject to any disclaimer, the term of this patent is extended or adjusted under 35 U.S.C. 154(b) by 0 days.

(21) Appl. No.: 14/367,414

(22) PCT Filed: Dec. 14, 2012

(86) PCT No.: PCT/EP2012/005161
§ 371 (c)(1),
(2) Date: Jun. 20, 2014

(87) PCT Pub. No.: WO2013/091802
PCT Pub. Date: Jun. 27, 2013

(65) Prior Publication Data
US 2015/0001064 A1 Jan. 1, 2015

(30) Foreign Application Priority Data
Dec. 22, 2011 (EP) .................................. 11010102

(51) Int. Cl.
*C23C 14/34* (2006.01)
*C23C 14/32* (2006.01)
*H01J 37/32* (2006.01)

(52) U.S. Cl.
CPC .......... *C23C 14/345* (2013.01); *C23C 14/325* (2013.01); *H01J 37/32055* (2013.01); *H01J 37/32568* (2013.01)

(58) Field of Classification Search
CPC ................. C23C 14/325; C23C 14/345; H01J 37/32055; H01J 37/32568
(Continued)

(56) References Cited

U.S. PATENT DOCUMENTS 3,624,848 A * 12/1971 Snaper ..................... A63B 6/00
5/420
4,505,947 A * 3/1985 Vukanovic ............ C23C 14/325
204/192.1
(Continued)

FOREIGN PATENT DOCUMENTS

EP 1 189 258 * 3/2002
EP 1 970 464 A1 9/2008
(Continued)

OTHER PUBLICATIONS

International Search Report for PCT/EP2012/005161 dated Mar. 26, 2013.

*Primary Examiner* — Rodney G McDonald
(74) *Attorney, Agent, or Firm* — Pearne & Gordon LLP (57) ABSTRACT

Coating method for arc coating or arc ion plating coating of substrates in a vacuum chamber in which using an arc evaporator solid material that functions as cathode is evaporated, during arc evaporation the motion of the cathode spot on the solid material surface is accelerated using a magnetic field for avoiding ejection of a large amount of macroparticles or droplets from the solid material surface, negative charged particles resulted from the arc evaporation flow from the cathode to an anode, characterized by the motion of the negative charged particles from the cathode to the anode fundamentally doesn't cause an additional increase of the absolute value of the potential difference between cathode and anode allowing a lower increment of the substrate temperature during coating.

18 Claims, 6 Drawing Sheets

(58) Field of Classification Search
USPC .................................... 204/192.38, 298.41
See application file for complete search history.

(56) References Cited

U.S. PATENT DOCUMENTS

| | | | |
|---|---|---|---|
| 4,551,221 A | 11/1985 | Axenov | |
| 4,929,322 A * | 5/1990 | Sue | C23C 14/325 |
| | | | 118/726 |
| 6,103,074 A * | 8/2000 | Khominich | C23C 14/228 |
| | | | 204/192.38 |
| 6,338,779 B1 * | 1/2002 | Shi | H01J 37/32055 |
| | | | 204/192.38 |
| 6,533,908 B1 * | 3/2003 | Meyer et al. | 204/192.37 |
| 2010/0316814 A1 * | 12/2010 | Nakamura | C23C 14/0605 |
| | | | 427/569 |

FOREIGN PATENT DOCUMENTS

| | | | |
|---|---|---|---|
| JP | 08-213194 | * | 8/1996 |
| JP | 2001-011606 | * | 1/2001 |
| JP | 2004-353023 A | | 12/2004 |

* cited by examiner

LOW TEMPERATURE ARC ION PLATING COATING

The present invention relates to a low temperature arc ion plating (AIP) deposition method for producing thin films which exhibit smooth surface and excellent mechanical properties.

STATE OF THE ART

The AIP technique is one of the most common physical vapor deposition (PVD) coating processes characterized by using cathodic arc sources for the evaporation of the coating material in vacuum conditions (working pressure about $10^{-2}$ to $10^{-4}$ mbar). By cathodic arc deposition a high power electric arc discharged at the target (material source) results in the evaporation of some target material and hence a highly ionized vapor is provided to be deposited onto the substrate.

The term IP (ion plating) refers to the bombardment of the substrate to be coated with energetic positively charged ions during coating process, which can be achieved by applying a bias voltage at the substrate. It promotes the condensation of high density coatings on the substrate. Additionally, reactive gases such as nitrogen, acetylene or oxygen may be also introduced into the vacuum chamber during evaporation in order to deposit coatings which comprise different compounds resulted from the reaction between the evaporated and ionized material and the reactive gas.

AIP-deposited coatings exhibit usually in addition to the already above mentioned high density also very good adhesion to substrate (strong bond between coating and substrate) and at large high quality, especially regarding physical, structural and tribological properties. These coatings exhibit currently also high hardness and a very good cutting performance.

Another important advantage of using the AIP technique is the achievement of high coating deposition rates in comparison to other competitive PVD techniques such as magnetron sputtering ion plating (MSIP) coating deposition.

One downside of the arc evaporation process is however that if the cathode spot stays at an evaporative point for too long time it can eject a large amount of macro-particles or droplets. These droplets are detrimental to the performance of the coating as they are poorly adhered and can extend through the coating. By not allowing the cathode spot to remain in one target position for too long time the number of droplets in coating film can be reduced. Therefore magnetic fields are used to control the motion of the arc.

Often are AIP processes not used for coating of temperature sensitive substrates such as plastic materials and stainless steel because of the relative high substrate temperatures achieved by coating process (higher than 300° C.).

According to the state of the art it is possible to accomplish arc ion plating processes at low temperatures (at 300° C. or lower temperatures) by modifying some coating process parameters or coating conditions as following:

Reducing arc current at target or operating a lower number of targets during coating process. This action involves an associated and unavoidable reduction of the coating deposition rate what is disadvantageous.

Don't applying a bias voltage or applying a reduced bias voltage at substrate during coating process. This action is also disadvantageous because the produced coatings exhibit lower density and in general inferior mechanical properties.

Removing of heat energy from the substrate continuously during coating process. In this case an active cooling system must be installed in the coating machine for the necessary heat transfer between coolant and substrate during coating process in order to extract the heat energy excess or undesirable heat energy from substrate. This action can be very complex and expensive.

Don't using magnetic fields or using weakly magnetic fields or rather low magnetic field intensities. In this manner it is possible to execute the coating process using colder coating plasmas characterized by lower electric potential than and same electric current like equivalent hotter coating plasmas and consequently having lower electric power. It helps to reduce the yield of heat energy into the substrate during coating process. This action involves the disadvantage that the cathode spot moves slower on the target surface and consequently remains for longer time at each evaporative point which leads to ejection of a larger amount of macro-particles or droplets.

OBJECTIVE OF THE PRESENT INVENTION

It is an objective of the present invention to provide a low temperature arc ion plating deposition method for coating temperature sensitive substrates that overcome the above mentioned disadvantages of the state of the art. Particularly, the low temperature arc ion plating deposition method should allow that the substrate temperature during coating be maintained under 350° C., preferably under 300° C. or even if necessary between 100° C. and 300° C. or lower. Furthermore, the thin films produced by the low temperature arc ion plating coating method according to the present invention should exhibit smooth surface and excellent mechanical properties or rather a similar coating quality in comparison to equivalent thin films deposited at higher substrate temperatures. Moreover the coating method according to the present invention should allow coating deposition rates that are equal to those attained by deposition of equivalent coating films by higher substrate temperatures.

DESCRIPTION OF THE PRESENT INVENTION

The present invention relates to an arc ion plating coating deposition method as described in the claim 1.

The invention will be subsequently explained in more detail:

Firstly, the situation by state of the art will be analyzed again in order to get a better comprehension of the present invention.

Higher coating deposition rates are generally attained by using increased arc currents and/or by operating a larger number of targets by coating process but higher arc currents are obligatory associated to higher plasma discharge electric power and consequently to higher substrate temperatures as already explained above.

Likewise, higher coating densities and enhanced mechanical properties including even in case of particular coating systems significantly increased coating hardness can be obtained by applying determinate bias voltages. For this reason accomplishing coating process without bias voltage or using reduced bias voltages in order to obtain lower substrate temperatures results normally in inferior coating quality in comparison to equivalent coatings deposited at higher temperatures.

Besides, the utilization of active cooling systems for cooling of the substrate is also undesirable because of the complexity and high expenses that are obligatory involved with it.

Furthermore, high magnetic field intensities are especially good for producing arc-deposited coating films having reduced droplets amount and size, in other words for producing arc-deposited coating films exhibiting lower roughness. However, high magnetic field intensities lead to high ionization of the process gas which results in increased plasma discharge voltages and higher plasma discharge electron temperatures. This plasma conditions lead subsequently to higher yields of heat energy into the substrate and consequently to higher substrate temperatures.

Taking all aspects described above the inventors propose then the creation of a coating plasma discharge but in such a way that it could be generated using exactly the same coating parameters used by an already known high temperature AIP coating process, in particular regarding arc current, number of activated targets, bias voltage and magnetic field intensity, however exhibiting a considerably lower electric potential and consequently a considerably lower electric power in comparison to the typically generated hotter coating plasma discharge. In doing so, it would be possible to produce coating films having same or essentially same coating deposition rates and same or essentially same coating qualities than those coating films produced by higher substrate temperatures but in this case produced by considerably lower substrate temperatures (about 100° C. to 300° C. or lower).

The inventors propose fundamentally the prevention of an additional increment of the electric potential caused by using high magnetic field intensities.

In order to understand better the inventive idea the typical case by state of the art that occurs when high magnetic field intensities are used (see FIG. 1) will be analyzed further in more detail:

Negative charged particles 107 generated by arc evaporation process are released from the target (cathode) and directed to the anode. The anode is usually placed far away from the cathode and can be for example the chamber 103. When high magnetic field intensities are used (about 40 Gauss-500 Gauss), the negative charged particles flowing to the anode are influenced by the magnetic field lines (not pictured in FIG. 1) in such a manner that they flow from the cathode across the magnetic field in spiral motion trajectory 109 until the anode (in this case the chamber wall 103) is reached. This phenomenon involves some physical interactions such as the ionization of process gas which result in an electric potential jump in front of the cathode and consequently in an increment of the electric potential and power in coating plasma discharge which accordingly results in increased yield of heat energy into the substrate and subsequently increment of the substrate temperature.

Taking all these factors into account, the inventors propose a first preferred embodiment, whereat the coating method according to the invention comprises a step in which the anode is placed as closely to the cathode as possible.

A further preferred embodiment of a coating method according to the invention comprises a step in which the magnetic field lines or at least the majority of the magnetic field lines are directed directly from the cathode to the anode.

Figure 2:
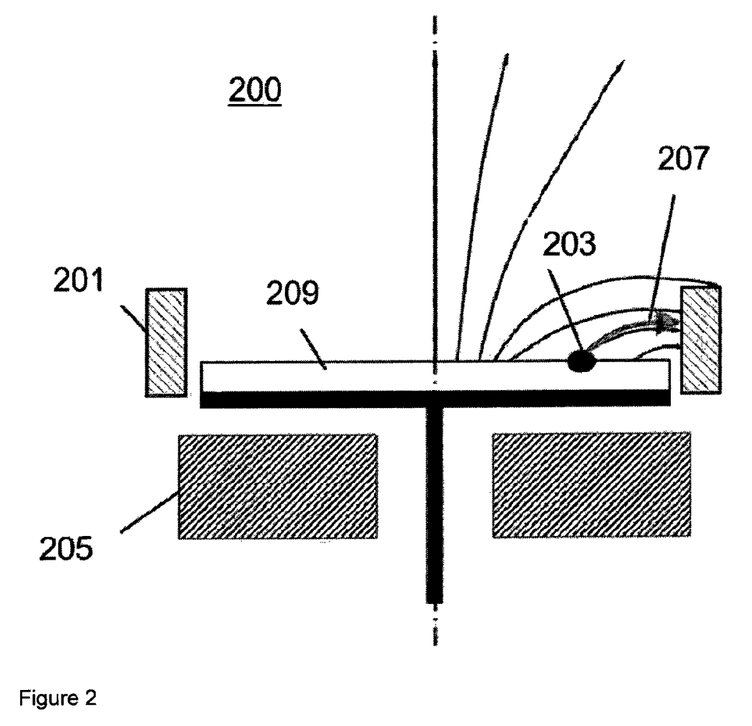
FIG. 2 shows an arc evaporator for coating using a method according to the invention.

One more preferred embodiment of a coating method according the present invention considers that the anode position and geometry in relation to the cathode allow that the magnetic field lines meet the surface anode basically perpendicularly or at least forming an angle of at least 45° in relation to the anode surface (see FIG. 2).

In other preferred embodiment of a coating method according the present invention the anode 201 position and geometry in relation to the cathode 209 are chosen so that the magnetic field lines (pictured in FIG. 2 but not numbered) and the electric field lines 207 which meet the surface anode are essentially parallel (see FIG. 2).

All embodiments of the present invention mentioned above helps to avoid a prominent spiral motion of the charged particles by flowing from the cathode to the substrate.

Following some examples and figures will be described in order to explain more aspects of the present invention. The core of the present invention may not be limited by these examples and figures.

DETAILED DESCRIPTION

Figure 1:
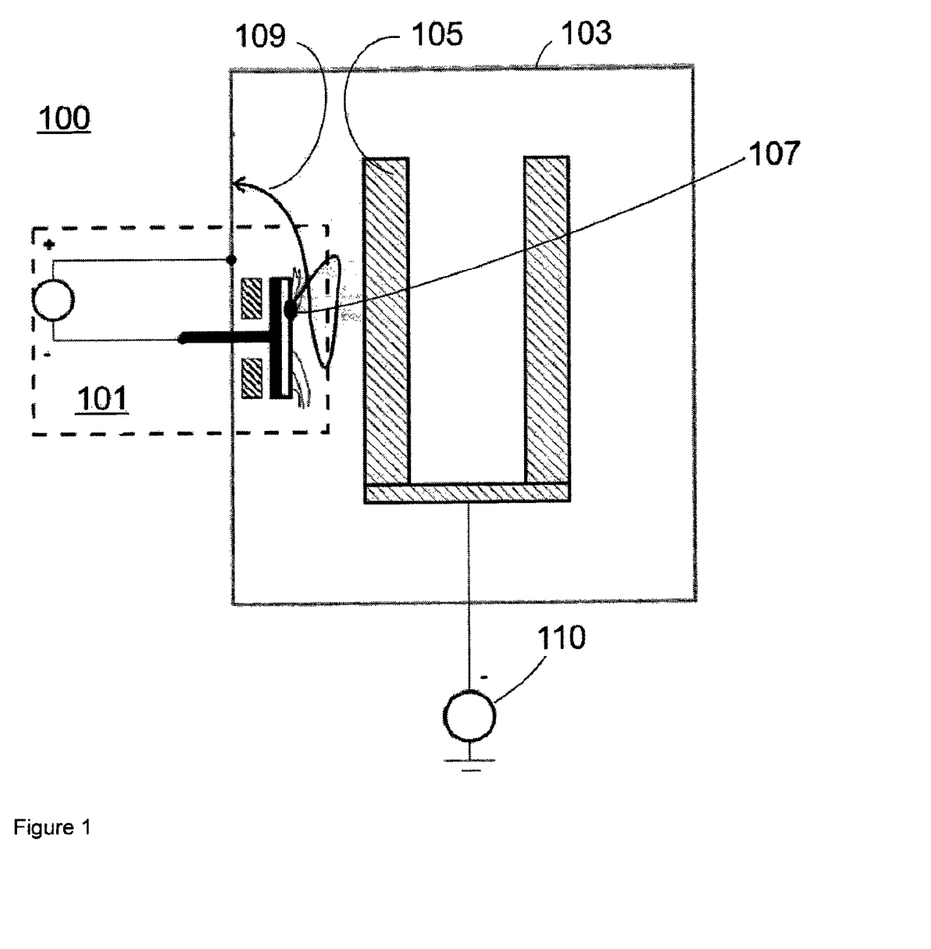
FIG. 1 shows an arc coating system according to the state of the art.
Figure 3:
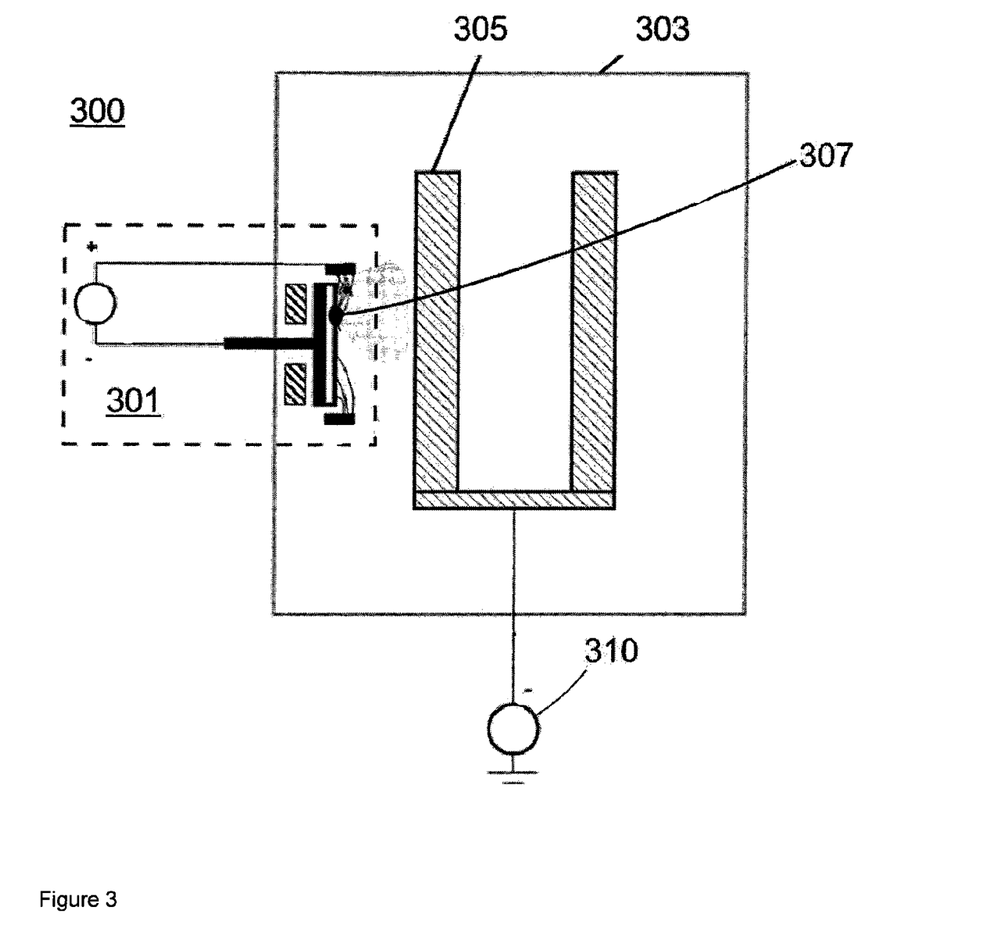
FIG. 3 shows an arc coating system.
Figure 4:
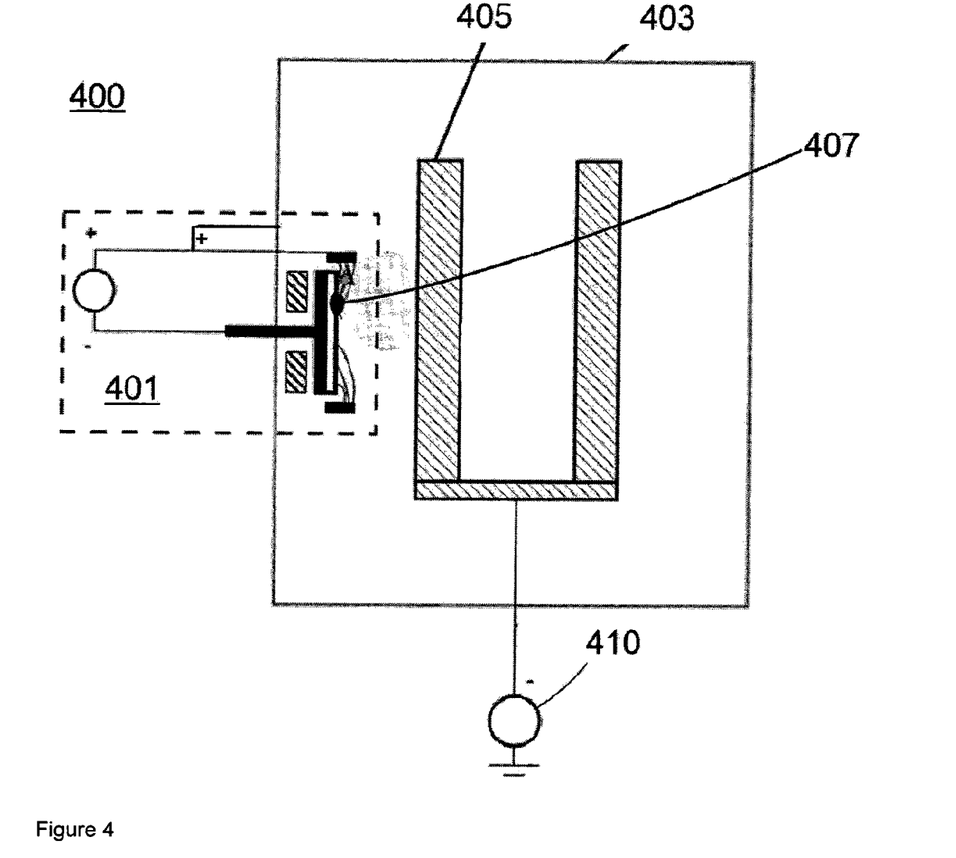
FIG. 4 shows another arc coating system.

FIG. 1 shows a drawing of an arc coating system 100 according to the state of the art containing:
  100: arc coating device according to state of the art
  101: arc evaporator
  103: coating chamber
  105: substrate fixture and or substrate to be coated
  107: evaporation point, where evaporated and charged particles are formed
  109: trajectory of the negative charged particles produced by evaporation of the target or solid material source by flowing from cathode to anode
  110: power supply unit for supplying bias voltage FIG. 2 shows a drawing of an arc evaporator for coating using a method according to the present invention containing:
  200: arc evaporator according to the present invention
  201: anode placed according to the present invention
  203: evaporation point, where evaporated and charged particles are formed
  205: magnetic means for a creation of a magnetic field
  207: trajectory of the negative charged particles produced by evaporation of the target or solid material source by flowing from cathode to anode
  209: target or solid material to be evaporated FIG. 3 shows a drawing of an arc coating system 300 according to present invention and corresponding to the inventive case 2 described in example 1 containing:
  300: arc coating device for coating according to a coating method according to the present invention
  301: arc evaporator according to the present invention
  303: coating chamber
  305: substrate fixture and or substrate to be coated
  307: evaporation point, where evaporated and charged particles are formed
  310: power supply unit for supplying bias voltage FIG. 4 shows a drawing of an arc coating system 400 according to present invention and corresponding to the inventive case 3 described in example 1 containing:

400: arc coating device for coating according to a coating method according to the present invention 401: arc evaporator according to the present invention 403: coating chamber 405: substrate fixture and or substrate to be coated 407: evaporation point, where evaporated and charged particles are formed 410: power supply unit for supplying bias voltage

EXAMPLE 1

The inventors accomplished three variants of the same coating process in order to compare the electric potential values of the generated coating plasma discharges. Following coating process parameters were fixed and maintained constant by all of the three analyzed coating process variants:

Process gas: $N_2$
Target composition: Ti:Al 50:50 at %
Arc current at target ($I_{ARC}$): 200 A
Number of activated targets by coating: 1
Intensity of the used magnetic field was about 60 Gauss
Bias voltage: 0 V
Process gas flow and bias voltage were equal for other process variants and in all the cases were maintained constant during coating process.

Potential difference between cathode and anode ($U_{ARC}$) as well as overall yield of heat energy transferred to cooling fluid ($Q_{TOTAL}$) was measured. Total introduced electric power in coating process ($P_{TOTAL}$) was calculated multiplying $U_{ARC}$ and $I_{ARC}$ ($P_{TOTAL}=U_{ARC} \times I_{ARC}$). The overall yield of heat energy transferred to cooling fluid is a result of the sum of the heat energy yields dispensed in the cooling fluid (in these cases water) in the target cooling plate ($q_{CATHODE}$), chamber walls cooling system ($q_{CHAMBER}$) and anode cooling system ($q_{ANODE}$). It was verified that colder coating plasma discharges which exhibit substantially lower heat energy ($q_{PLASMA}$) or rather substantially lower electric power ($P_{PLASMA}$) can be produced according to the invention. Surprisingly using the method according to the invention was possible to diminish the heat energy in plasma in a factor greater than 10 times (see in table 1).

TABLE 1

Energy balance for comparison of heat energy in coatings plasmas according to the state of the art and according to the present invention.

| Energy balance/ Power balance | Variant 1 anode = chamber according to state of the art | Variant 2 anode = anode according to the invention | Variant 3 anode = anode according to the invention + chamber |
|---|---|---|---|
| $U_{ARC}$ [V] | 30.21 | 21.69 | 21.5 |
| $P_{TOTAL}$ [W] | 6042 | 4338 | 4300 |
| $q_{CATHODE}$ [W] | 2082 | 1512 | 1443 |
| $q_{CHAMBER}$ [W] | 203 | 296 | 291 |
| $Q_{TOTAL}$ [W] | 3175 | 4099 | 4026 |
| $q_{PLASMA} \cong P_{PLASMA}$ | 2867 | 239 | 274 |

The three coating process variants vary only in the placement of the anode related to the cathode. The first analyzed coating process variant is pictured in FIG. 1 and correspond to a commonly used state of the art variant in which the coating chamber 105 is used as anode. The second and third analyzed coating process variants are pictured respectively in FIGS. 3 and 4 and corresponding to variants according to the present invention. The second analyzed coating process variant correspond to the configuration pictured in FIG. 3, the anode is placed very close to the substrate and the magnetic field lines or the majority of the magnetic field lines (not pictured in FIG. 3) are directed directly from target (cathode) to anode. The third analyzed coating process variant correspond to the configuration pictured in FIG. 4, in this case an anode is placed similarly and in case 2 (FIG. 3) but the anode is additionally electrically connected to the coating chamber in such a way that both anode and coating chamber are at the same electric potential and consequently become to be the anode. In other words in case 3 anode+coating chamber together function as same anode.

EXAMPLE 2

Figure 5:
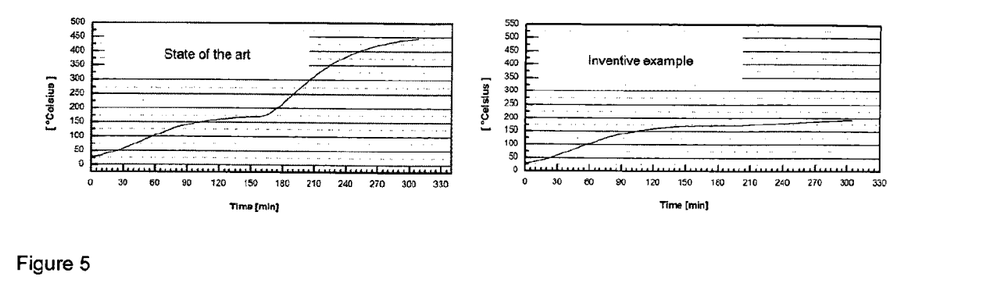
FIG. 5 shows graphs of substrate temperature.

Two kind of AlCrN coating films were deposited by using same coating parameters but a first time using an anode arranged according to the state of the art and a second time using an anode arranged according to the present invention. Both coating films exhibited very good coating quality and essentially same coating properties. The only clear difference was the substrate temperature attained by these coating processes. In the first case the maximal substrate temperature attained by coating was about 475° C., while by coating in the second case a maximal coating temperature of 210° C. was attained. That verified a stupendous diminution of the substrate temperature as it is shown in FIG. 5.

In both cases 1 and 2 a constant arc current per target of 150 A was used during coating.

Figure 6:
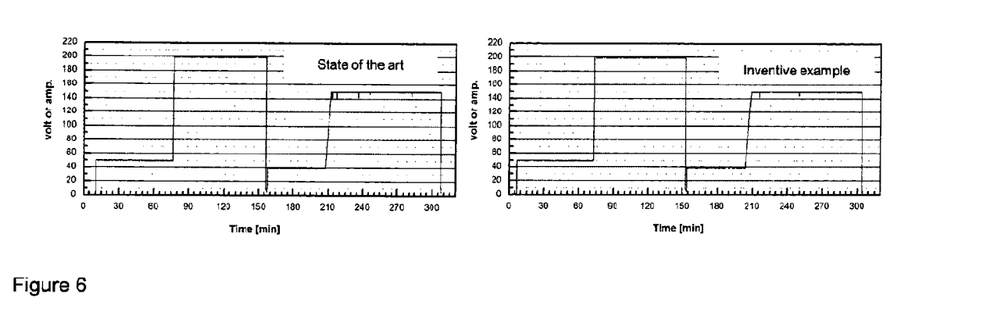
FIG. 6 shows graphs of bias voltage.

The bias voltage was also identical in both cases 1 and 2. Two different bias voltage values were set during coating, as it is shown in FIG. 6, in order to analyze the influence of this parameter when the coating process is accomplished according to the present invention.

Figure 7:
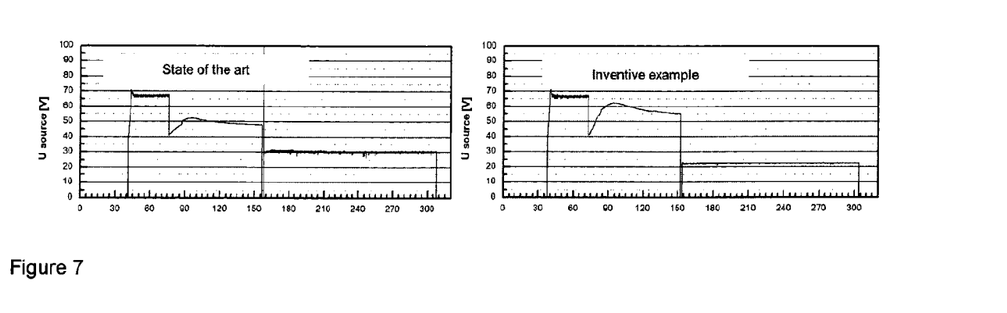
FIG. 7 shows graphs of cathode voltage.

A diminution of the cathode voltage using the coating method according to the invention could be verified as it is shown in FIG. 7.

Figure 8:
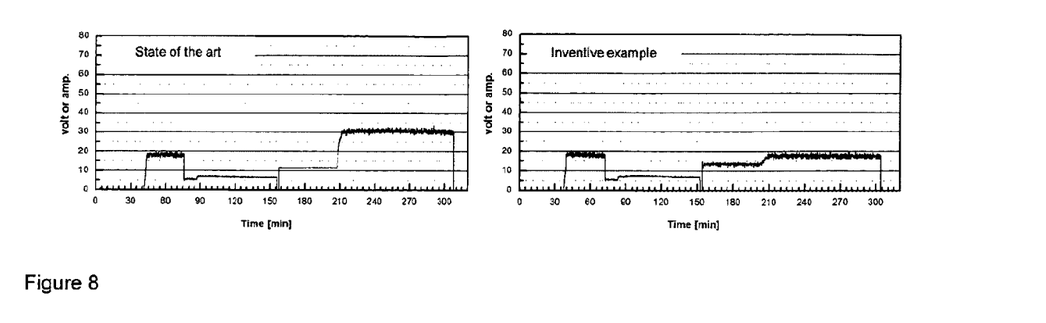
FIG. 8 shows graphs of bias current.

Astonishingly also a considerably diminution of the bias current at target was obtained using the method according to the invention as it is shown in FIG. 8.

Any relevant difference relating coating hardness, Young module, adhesion to substrate and X-ray spectrum were observed between coatings deposited by high temperatures (about 350° C.-500° C.) according to the state and coatings deposited by low temperatures (about 100° C.-300° C. or lower) by using same coating parameters.

Figure 9:
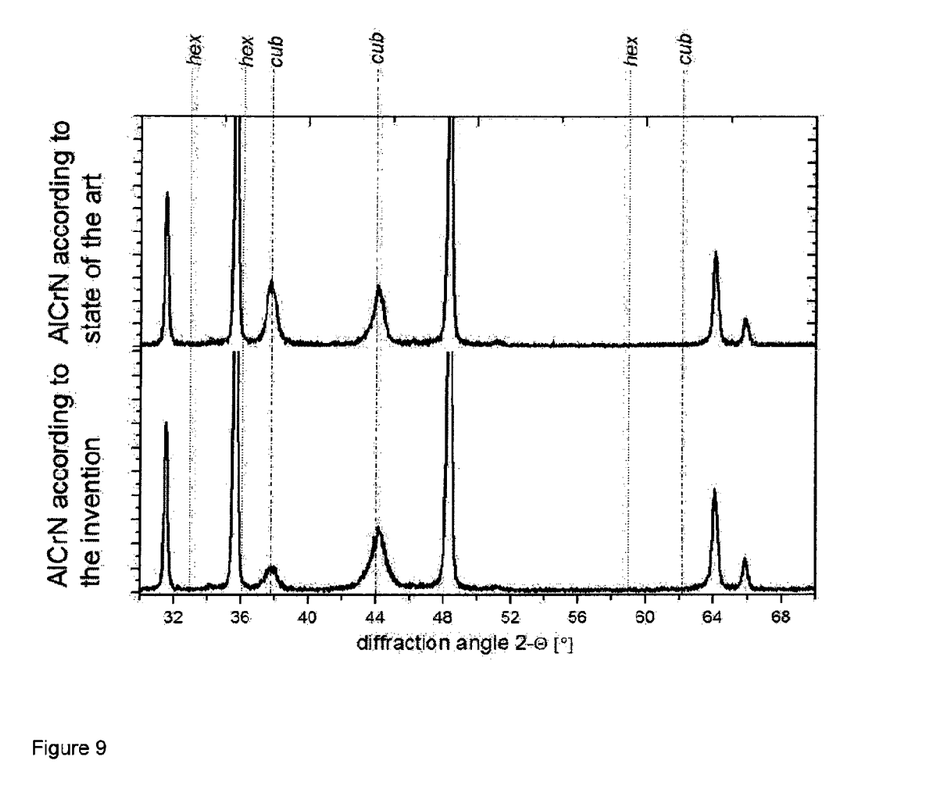
FIG. 9 shows X-ray spectrum of coatings.

In FIG. 9 are two X-ray spectrums corresponding to an AlCrN coating deposited according to the state of the art by a substrate temperature of about 400° C.-450° C. (above) and an AlCrN coating deposited by same coating parameters but according to the present invention (below).

What is claimed is:

1. Coating method for arc coating or arc ion plating coating of substrates in a vacuum chamber in which a coating plasma discharge is generated using an arc evaporator in such a manner that a target placed at the arc evaporator and consisting of solid material functions as a cathode and is evaporated, during arc evaporation a motion of a cathode spot on a solid material surface of the solid material is accelerated using a magnetic field having predetermined magnetic field intensities for avoiding ejection of a large amount of macro-particles or droplets from the solid material surface, negative charged particles resulted from the arc evaporation exit the solid material surface of the cathode and flow to an anode, wherein at least part of the anode is separate from walls of the vacuum chamber, characterized by an additional increment of an electric potential of the coating plasma caused by using said magnetic field intensities is prevented by placing the anode and the cathode such that a portion of the anode overlapping a lateral side surface of the cathode is in a line of sight of the lateral side surface of the cathode, and by directing magnetic field lines of the magnetic field or at least a majority of the magnetic field lines directly from the solid material surface of the cathode to a surface of the anode along paths that are free of other components and wherein a position and geometry of the anode in relation to the cathode is chosen in such a manner that the magnetic field lines and electric field lines are parallel at the surface of the anode, so that a prominent spiral motion of the negative charged particles by flowing from the cathode to the anode is avoided and in doing so a lower increment of a substrate temperature during coating is attained.

2. Method according to claim 1, characterized by the intensity of the magnetic field is a high magnetic field intensity which is about 40 Gauss to 500 Gauss.

3. Method according to claim 1, characterized by a position and geometry of the anode in relation to the cathode are chosen in such a manner that the magnetic field lines meet the surface of the anode substantially perpendicularly or at least forming an angle of at least 45° in relation to the surface of the anode.

4. Method according to claim 1, characterized by the substrate temperature is between 100° C. and 300° C. or lower.

5. Method according to claim 1, characterized by the target comprises aluminium.

6. Method according to claim 1, characterized by the target comprises titanium and/or chromium.

7. Method according to claim 1, characterized by the intensity of the magnetic field is about 60 Gauss.

8. Method according to claim 1, characterized by a heat energy of the plasma is diminished by a factor greater than 10 times.

9. Method according to claim 1, characterized by a diminished cathode voltage.

10. Method according to claim 1, characterized by a bias current during coating is lower in comparison with a coating process in which identical coating parameters are used and the anode further includes the walls of the vacuum chamber.

11. Coating method for arc coating or arc ion plating coating of substrates in a vacuum chamber in which a coating plasma discharge is generated using an arc evaporator in such a manner that a target placed at the arc evaporator and consisting of solid material functions as a cathode and is evaporated, during arc evaporation a motion of a cathode spot on a solid material surface of the solid material is accelerated using a magnetic field having predetermined magnetic field intensities for avoiding ejection of a large amount of macro-particles or droplets from the solid material surface, negative charged particles resulted from the arc evaporation exit the solid material surface of the cathode and flow to an anode, wherein at least part of the anode is separate from walls of the vacuum chamber, characterized by an additional increment of an electric potential of the coating plasma caused by using said magnetic field intensities is prevented by placing the anode and the cathode such that a space between a portion of the anode overlapping a lateral side surface of the cathode and the lateral side surface of the cathode is unobstructed, and by directing magnetic field lines of the magnetic field or at least a majority of the magnetic field lines directly from the solid material surface of the cathode to a surface of the anode along paths that are free of other components and wherein a position and geometry of the anode in relation to the cathode is chosen in such a manner that the magnetic field lines and electric field lines are parallel at the surface of the anode, so that a prominent spiral motion of the negative charged particles by flowing from the cathode to the anode is avoided and in doing so a lower increment of a substrate temperature during coating is attained.

12. Method according to claim 11, characterized by the intensity of the magnetic field is a high magnetic field intensity which is about 40 Gauss to 500 Gauss.

13. Method according to claim 11, characterized by a position and geometry of the anode in relation to the cathode are chosen in such a manner that the magnetic field lines meet the surface of the anode substantially perpendicularly or at least forming an angle of at least 45° in relation to the surface of the anode.

14. Method according to claim 11, characterized by the substrate temperature is between 100° C. and 300° C. or lower.

15. Method according to claim 11, characterized by the target comprises one of aluminium, titanium, and chromium.

16. Method according to claim 11, characterized by the intensity of the magnetic field is about 60 Gauss.

17. Method according to claim 11, characterized by a diminished cathode voltage.

18. Method according to claim 11, characterized by a bias current during coating is lower in comparison with a coating process in which identical coating parameters are used and the anode further includes walls of the vacuum chamber.

* * * * *